United States Patent [19]

Yoshimura

[11] Patent Number: 5,017,209
[45] Date of Patent: May 21, 1991

[54] HIGH TEMPERATURE FURNACE WITH THERMAL INSULATION

[75] Inventor: Ichiro Yoshimura, Yokohama, Japan

[73] Assignee: Sumitomo Electric Industries, Ltd., Osaka, Japan

[21] Appl. No.: 352,951

[22] Filed: May 17, 1989

[30] Foreign Application Priority Data

May 19, 1988 [JP] Japan .................. 63-120532

[51] Int. Cl.⁵ .................. C03B 37/029; F27D 1/00
[52] U.S. Cl. .................. 65/13; 65/374.13; 65/374.15; 165/135; 373/137; 432/247
[58] Field of Search .................. 65/13, 11.1, 374.13, 65/374.15, DIG. 4, 144; 165/135; 432/247; 110/336; 373/137, 155, 164; 428/107, 113, 114, 295, 302

[56] References Cited

U.S. PATENT DOCUMENTS 3,096,083 7/1963 Keon .................. 165/135
3,327,041 6/1967 Clune et al. .................. 432/247
3,940,244 2/1976 Sauder et al. .................. 432/247
4,304,582 12/1981 Aussenegg et al. .................. 65/13

FOREIGN PATENT DOCUMENTS 2079422 1/1982 United Kingdom .

Primary Examiner—Joye L. Woodard
Attorney, Agent, or Firm—Cushman, Darby & Cushman

[57] ABSTRACT

A furnace comprising a cylindrical heater and a cylindrical insulation around the heater, wherein the insulation has anisotropy in heat transfer and a direction along which the thermal conductivity of the insulation is small corresponds to a direction along which temperature gradient within the insulation is steep. The insulation is formed of plural anisotropic parts arranged such that the direction along which thermal conductivity is low of one part blocks heat transfer from a direction along which the thermal conductivity of another part is high.

3 Claims, 3 Drawing Sheets

HIGH TEMPERATURE FURNACE WITH THERMAL INSULATION

BACKGROUND OF THE INVENTION

1. Field of the Invention

The present invention relates to the thermal insulation of a furnace such as an optical fiber drawing furnace, a sintering furnace for a glass preform for an optical fiber glass preform; a semiconductor pulling-up furnace and the like, particularly those used at a high temperature, for example, higher than 1000° C. Hereinafter, this type of furnace will be generally referred to as a high temperature furnace.

2. Description of the Related Art

When the high temperature furnace is thermally insulated in order to reduce heat loss, usually a carbon felt, a ceramic fiber felt or the like is used as an insulation of the furnace. In order to prevent the fibers in the felt from scattering, such the insulation is contained in a cylindrical container, or shaped into a cylindrical form of molded felt.

When a shaped felt is used as the insulation in the furnace, as shown in FIG. 1, the shaped felt 3 is disposed around a heater 2 which is installed around a muffle tube 1. With the use of the shaped felt as described above, the heat loss through a container containing the felt can be advantageously eliminated since the container can be omitted. It may also be possible to coat the shaped felt with carbon cement in order to prevent the fibers from scattering.

Further, the shaped felt as shown in FIG. 2 has been proposed. This has a three layer configuration consisting of the three shaped felt parts 3a, 3b and 3c. In this configuration, the innermost shaped felt part 3a, which is heated to the highest temperature, is made of a better insulating material with a higher density, while the outermost layer 3c, which is not heated to as high of a temperature, is made of a material with a smaller heat capacity and a smaller density. With such a configuration, a combination of the better thermal insulation with the smaller heat capacity can be achieved.

In order to reduce the heat loss, other methods have also been proposed. In one method, a cylindrical container containing inorganic powder such as carbon powder or zirconia powder is used. In another method, a sheet material made of carbon, molybdenum or the like which reflects the infrared rays is used in order to decrease the heat loss due to thermal radiation.

In principle, optical fibers to semiconductors can be most efficiently produced when a large amount of raw material is treated in the furnace. However, it is not practical to treat a large amount of material in the absence of effective thermal insulation, since the furnace requires a larger scale facility and also consumes a larger amount of electrical energy.

SUMMARY OF THE INVENTION

An object of the present invention is to provide an efficient thermal insulation to construct a more effective furnace without enlarging the scale of the facility or increasing the amount of consumed electrical energy.

According to the present invention, there is provided a furnace comprising a cylindrical heater and a cylindrical insulation around the heater, wherein the insulation is anisotropic in heat transfer, and a direction along which a thermal conductivity of the insulation is small corresponds to a direction along which a temperature gradient within the insulation is steep.

DETAILED DESCRIPTION OF THE INVENTION

Within the insulation of the high temperature furnace, the temperature gradient is not uniform, but is gentle or steep in different directions. Heat tends to be transferred from a high temperature zone to a low temperature zone in the direction along which the temperature gradient is steep. Therefore, in the thermal insulation, it is most effective to prevent the heat transfer along this direction.

The amount of heat transferred per unit area of insulation can be calculated according to the following equation:

$$H = \lambda \times \Delta T$$

wherein H is the amount of the heat transferred per unit area of the insulation, $\lambda$ is the thermal conductivity of the insulation and $\Delta T$ is the temperature gradient within the insulation.

Accordingly, a less amount of heat is transferred in the direction along which the temperature gradient is gentle (that is, $\Delta T$ is small) while a larger amount of the heat is transferred along the direction in which the temperature gradient is steep (that is, $\Delta T$ is large).

According to the present invention, a material being anisotropic in heat transfer is used as the insulation around the heater of the furnace, and the direction along which the thermal conductivity of the insulation is small corresponds to the direction along which the temperature gradient within the insulation is steep. This results in the effective thermal insulation of the high temperature furnace.

The present invention will be further described with reference to the accompanying drawings.

Figure 3:
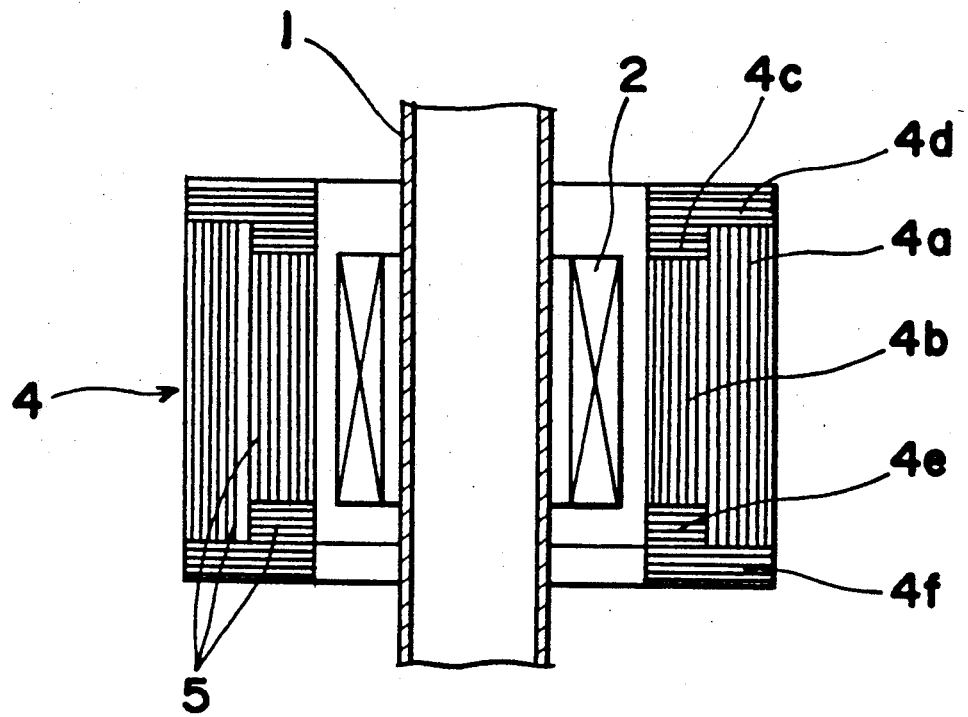
FIG. 3 shows a sectional view of one embodiment of the furnace according to the present invention.

FIG. 3 shows a sectional view of one embodiment of the furnace according to the present invention, in which a plurality of laminates are used as the insulation. The laminate consists of a plurality of graphite sheets which can also act as infrared ray reflecting sheets as described above.

In FIG. 3, the heater 2 is installed around the muffle tube 1, and the insulation 4 is disposed around the heater 2. The insulation 4 is a composite of cylindrical form as a whole and consists of six insulation parts 4a, 4b, 4c, 4d, 4e and 4f. The insulation part 4b constitutes the innermost cylindrical layer facing to the heater 2, on and under which the annular insulation parts 4c and 4e are disposed, respectively. The insulation part 4a is disposed around the insulation parts 4b, 4c and 4e to constitute the 4d and 4f are disposed on and under the insulation part 4a, respectively.

The insulation parts 4a to 4f are made of the laminate produced by laminating a plurality of the graphite sheets 5. These parts are disposed so that the laminating direction of each part is different as shown in FIG. 3. The term "laminating direction" is intended to mean the direction of increase in the thickness of the laminate by laminating the sheets. The cylindrical parts 4a and 4b are disposed peripherally and the parts 4c and 4d, and 4e and 4f are disposed axially, respectively relative to the axis of the muffle tube 1. The thermal conductivity of the graphite sheet 5 is smaller along the direction perpendicular to the major surface of the sheet (that is, the direction of the thickness of the sheet). On the contrary, the thermal conductivity along the major surface of the sheet is as large as ten times the small thermal conductivity.

In the high temperature furnace comprising the cylindrical heater and the muffle tube, heat generally tends to be transferred along the direction parallel to the muffle tube 1 and across the muffle tube 1. Hence, the temperature gradients along the two directions are particularly steep within the insulation.

In the furnace with the construction based on the present invention, the graphite sheets 5 are laminated in two directions along which the temperature gradients are steep. Therefore, the thermal conductivities along the directions are reduced to one tenth in comparison with the directions perpendicular to such two directions. According to the equation (1), then, the amount of the heat transferred through the insulation 4 is decreased, which leads to the effective insulation.

In the prior art, the directions of the fibers in the carbon felt are random, which results in the isotropic heat transfer in the insulation. This means that along the direction in which the temperature gradient is gentle, the thermal conductivity is small, and there is an excess of insulation. Therefore, along this direction, less insulation will be satisfactory. According to the present invention, the insulation in the direction along which the temperature gradient is gentle is reduced and the insulation in the direction along which the temperature gradient is steep is enhanced, resulting in improvements in the total efficiency of the thermal insulation of the high temperature furnace.

EXAMPLE AND COMPARATIVE EXAMPLES 1 AND 2

Figure 1:
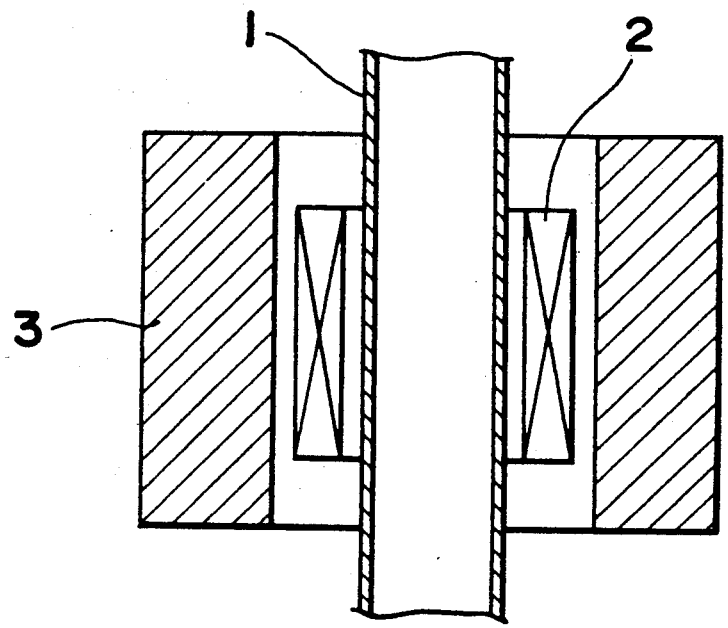
FIG. 1 shows a sectional view of a furnace of the prior art.
Figure 2:
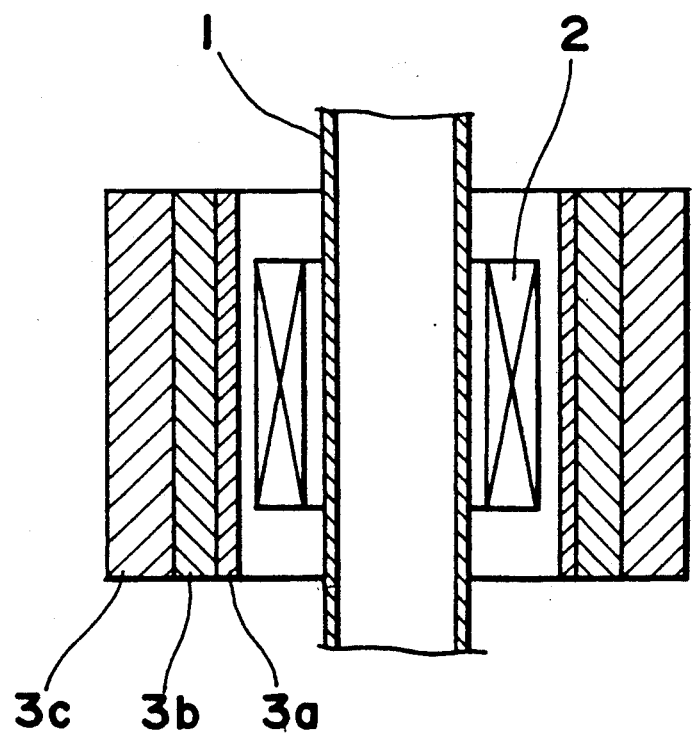
FIG. 2 shows a sectional view of another furnace of the prior art.
Figure 5:
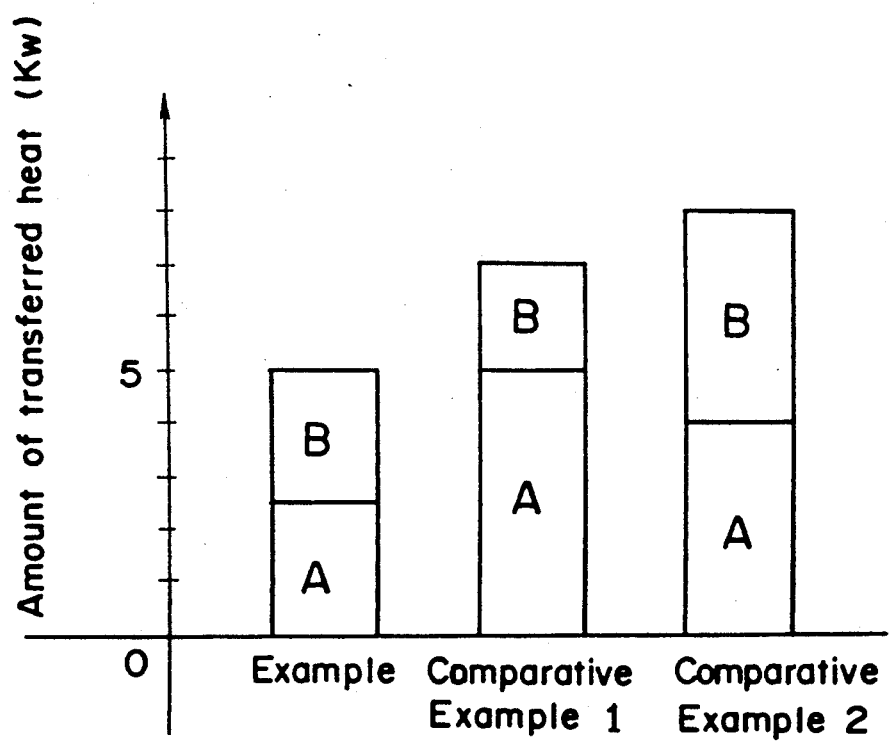
FIG. 5 shows graphically the results of the tests on the thermal insulation of the furnaces.

The furnaces of the present invention and the prior art were tested on the efficiency of the thermal insulation and the results are shown in FIG. 5. In Example, the furnace according to the present invention as shown in FIG. 3 was tested. In Comparative Examples 1 and 2, the furnaces of the prior art as shown in FIGS. 2 and 1, respectively, were tested.

In FIG. 5, each area A shows the amount of heat transferred along the direction parallel to the axis of the muffle tube 1, and each area B shows the amount of heat transferred along the direction perpendicular to the axis of the muffle tube 1. The amounts of transferred heat were determined from the temperature increase of a cooling water system (not shown) surrounding the furnace.

The temperature of the heater was 2000° C. in each example. The cylindrical insulation of each furnace had an inner diameter of 140 mm, an outer diameter of 350 mm and a length of 300 mm, as a whole. The size of each componeny constituting the insulation is shown in Table 1.

TABLE 1

| | Outer diameter (mm) | Inner diameter (mm) | Length (mm) |
|---|---|---|---|
| Example | | | |
| Part 4a | 350 | 250 | 250 |
| 4b | 250 | 140 | 200 |
| 4c | 250 | 140 | 25 |
| 4d | 350 | 140 | 25 |
| 4e | 250 | 140 | 25 |
| 4f | 350 | 140 | 25 |
| Comparative Example 1 | | | |
| Part 3a | 180 | 140 | 300 |
| 3b | 250 | 180 | 300 |
| 3c | 350 | 250 | 300 |

Each part was made by laminating graphite sheets having a thickness of 0.7 mm. The insulation of the furnace in Comparative Example 2 was made of carbon felt which was not anisotropic.

It can be clearly seen from the results shown in FIG. 5 that in Comparative Example 1 in comparison with Comparative Example 2, the amount of heat transferred along to the direction perpendicular to axis of the muffle tube (that is, area B) is reduced by virtue of the insulation of the three layer configuration insulation, but the amount of heat transferred along the direction parallel to the axis of the muffle tube (that is, area A) increases. As a result, the total amount of the transferred heat does not change considerably.

On the contrary, the example shows the use of the furnace according to the present invention. The amount of heat transferred, not only along the direction perpendicular to the axis of the muffle tube, but also along the direction parallel to the axis of the muffle tube are reduced by installing the thermally anisotropic insulation parts so that for each part, the direction along which the temperature gradient is steep may correspond to the direction along which the thermal conductivity of the insulation is small. Thus with the use of the present furnace, the amount of the transferred heat is reduced to about 60% of the transferred heat in Comparative Example 2.

The present invention has been described with reference to one embodiment of the present furnace comprising the composite insulation consisting of six parts of insulation 4, but the present invention is not limited to this embodiment.

Figure 4:
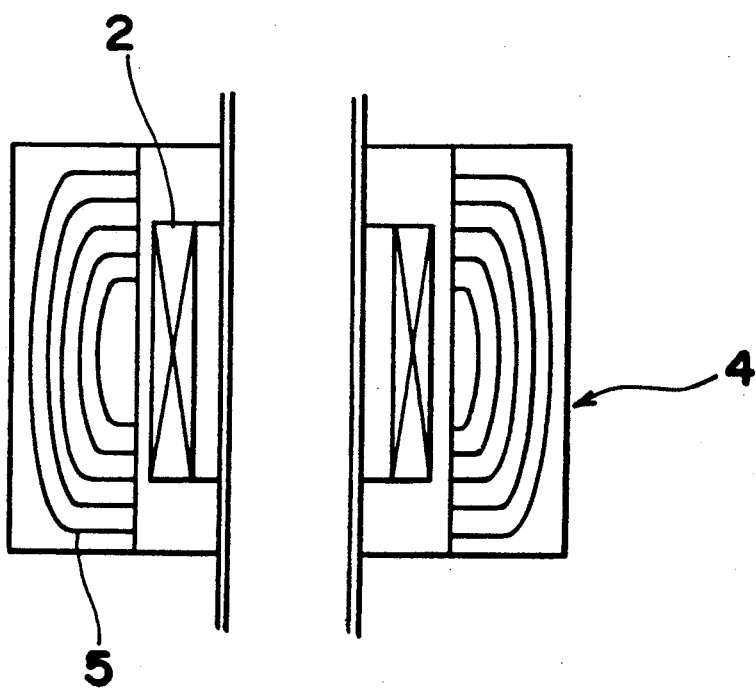
FIG. 4 shows a sectional view of another embodiment of the furnace according to the present invention.

For example, it is possible to constitute the composite insulation with a larger number of insulation parts. Also, as shown in FIG. 4, the graphite sheets 5 may be curved continuously to surround the heater 2, which results in more effective insulation.

The material constituting the insulation is not limited to a carbon sheet such as the graphite sheet, but can also be made of molybdenum. It is preferable to use a sheet of fibrous material in order to make the insulation anisotropic in heat transfer. Further, it is also possible to make the insulation anisotropic by constructing the insulation from aligned fibers of quartz, alumina or zirconia. As disclosed in U.S. Pat. No. 3,940,244, the fibers are aligned in parallel planes. Heat transfer is greatest along a plane parallel to these aligned fiber planes and is smallest along a plane perpendicular to the aligned fiber planes. This is also the case for the graphite sheets, as is disclosed in U.S. Pat. No. 3,096,083. Thus, in FIGS. 3 and 4 the heat transfer is at its least in a direction perpendicular to the parallel liens of the insulation parts and at its greatest in a direction parallel to the parallel lines of the insulation parts.

As explained with the preferred embodiments of the present invention, it is possible to insulate a high temperature furnace effectively by using, as the insulation, a material which is anisotropic in heat transfer having the direction along which the thermal conductivity of the insulation is small correspond to the direction along which the temperature gradient is steep. Thus, on insulating a high temperature furnace which treats a large mass of material, the problems as to the enlargement in the scale of the facility and the increase in the amount of the consumed electrical energy can be overcome.

What is claimed is:

1. A furnace comprising a cylindrical heater and a cylindrical insulation around the heater, wherein the insulation comprises a plurality of anisotropic insulation parts, at least one of the parts being positioned such that its direction along which thermal conductivity is low blocks heat transfer from a direction along which thermal conductivity of at least one other of the parts is high.

2. The furnace according to claim 1, wherein each of the insulation parts comprise a plurality of infrared ray reflecting sheets with small thermal conductivity which are laminated along the direction of thickness of the sheets.

3. A furnace according to claim 1, wherein each of the insulation parts comprises aligned ceramic fibers made of a material selected from the group consisting of carbon, quartz, alumina and zirconia.

* * * * *